United States Patent [19]

Haisma et al.

[11] 4,218,762
[45] Aug. 19, 1980

[54] DEVICE FOR CLOSE-PACKED MAGNETIC DOMAINS

[75] Inventors: Jan Haisma; Klaas L. L. Van Mierloo, both of Eindhoven, Netherlands

[73] Assignee: U.S. Philips Corporation, New York, N.Y.

[21] Appl. No.: 919,466

[22] Filed: Jun. 27, 1978

Related U.S. Application Data

[63] Continuation of Ser. No. 712,948, Aug. 9, 1976, abandoned.

[30] Foreign Application Priority Data

Aug. 15, 1975 [NL] Netherlands ............... 7509733

[51] Int. Cl.² .................. G11C 11/15; G11C 19/08
[52] U.S. Cl. ...................................... 365/32; 365/3; 365/19
[58] Field of Search .................. 365/2, 3, 19, 32

[56] References Cited
U.S. PATENT DOCUMENTS

| | | | |
|---|---|---|---|
| 3,996,571 | 12/1976 | Chang | 365/32 |
| 4,151,602 | 4/1979 | Haisma et al. | 365/32 |

OTHER PUBLICATIONS
IEEE Transactions on Magnetics, vol. Mag.-10, No. 3, Sep. 1974, pp. 630-633.

*Primary Examiner*—James W. Moffitt
*Attorney, Agent, or Firm*—Marc D. Schechter

[57] ABSTRACT

A device for storing digital information in the form of magnetic domains including at least two ferrimagnetic layers on a substrate. The ferrimagnetic layers are separated by a compensation wall and in the presence of a bias magnetic field single magnetic domains and superposed magnetic domain pairs, the superposed domains being separated by a compensation wall, are generated. All single and superposed domains are mutually repulsive. The domains within a superposed pair are attracted to each other. The generated domains are propagated to a shift register and when the reigster is filled a row of domains is coincidentally propagated, transversely out of the register, to a domain array region adjacent the register. Rows are then propagated through the array region to a second shift register where they are individually detected and annihilated. A control device assures the proper working relationship between all elements.

16 Claims, 16 Drawing Figures

DEVICE FOR CLOSE-PACKED MAGNETIC DOMAINS

This is a continuation of application Ser. No. 712,948, filed Aug. 9, 1976, now abandoned.

BACKGROUND OF THE INVENTION

The invention relates to a device for storing digital information in the form of magnetic domains. Such a device is known and comprises a control device which is connected to an information input, a nonmagnetic substrate layer, a first layer of magnetic material which is structurally integral therewith and in which magnetic domains can be sustained by a field of a bias magnetic fluid generator which field is transverse to the layer, a second layer of magnetic material which is structurally integral with the said first layer and in which further magnetic domains can be sustained by the field of the bias magnetic field generator, first means for successively generating a first series of magnetic domains in the first layer, and second means for successively generating a second series of magnetic domains in the second layer. The device is adapted to form, under the selective control of the control device and by cooperation by the first and second means, both single and superposed magnetic domain pairs in the first and second layers of magnetic material. Superposed magnetic domain pairs comprise a magnetic compensation wall at their interface. All non-superposed magnetic domains and superposed magnetic domain pairs always exhibit mutually repellent forces, including a force component in the plane of the layers. Each of the first and second layers of magnetic material comprise at least two magnetic crystalline sublattices with first and second magnetizations which are complementary within a layer and which have substantially opposed directions. The device further comprises propagation means for producing a relative displacement between the first and second means and the generated series of magnetic domains or magnetic domain pairs. It also comprises a detector unit for the separate detection of single magnetic domains and superposed magnetic domain pairs, and also an annihilation unit for destruction of magnetic domains and magnetic domain pairs.

Magnetic domains having a substantially circular shape are known as "bubbles". The above known device is described in the article "Observation of various types of bubbles bounded by a compensation wall", by J. Haisma et al, IEEE Transactions on Magnetics, volume MAG 10, 630. Magnetic bubbles are generally highly regarded, because they allow a high information density and because a constant supply of energy is not required for sustaining the information. The domains can be easily generated and displaced in a desired direction in the magnetic material. Domains of this kind can also be easily detected, inter alia by way of faraday rotation. Known devices which utilize domains containing information usually require a long information access time, because serial operation is required. The article discloses the possibility of providing pairs of superposed domains which enables optical detection in parallel.

SUMMARY OF THE INVENTION

An object of the invention is to a high information bit density. Another object of the invention is to realize simple accessibility of the information bits.

According to one aspect of the invention, in the above-described known device the said first and second means are connected together to an input of a first shift register for single magnetic domains or magnetic domain pairs or both, third means being provided for the coincident, propagation of magnetic domains or magnetic domain parts, present in a row the first shift register, in a direction transverse to and out of the first shift register. A control member is provided for activating the third means at instants whose intervals correspond to integral numbers of half periods of the drive in the first shift register by the propagation means. The intervals each time have at least a predetermined minimum value for the successive formation of rows of single magnetic domains or magnetic domain pairs or both in directions parallel to the first shift register in a two-dimensional domain array region which is situated adjacent thereto. Also provided are fourth means for combining the two-dimensional domain array region on edges thereof which are transverse to the first shift register, and fifth means for further combining the two-dimensional domain array region on an edge thereof which is remote from the first shift register.

The invention thus provides simple generation of domains, a domain position being capable of containing more than one bit of information in that each domain position can have more than two states. In the case of three states, two domain positions together can have nine states, which is more than three bits (which would correspond to $2^3 = 8$ states) The domains can be situated very near to each other in a domain array.

Domain arrays are to be understood to mean herein two-dimensional, more or less regular arrays of domains where the stability of the array is at least partly determined by the mutually repellent forces between the various domains.

In a device according to the invention, in the case of two layers of magnetic material there are three possibilities when at least one magnetic domain is present in a domain position. Due to the high stability of the array, the density of the domains per unit of area can thus be high. Besides the high information content per domain position, this high domain position density results in a further increase in the information density.

The intervals separating activation of the third means for coincident propagation preferably correspond to odd numbers of half periods of the propagation in the first shift register, the minimum value being one half unit smaller than the largest number of domain positions in a single row within the two-dimensional domain array region.

A close-packed two-dimensional hexagonal domain grid is thus easily formed.

Sixth means are preferably provided for advancing, in conjunction with the third means, a two-dimensional domain array in the direction transverse to the first shift register, away therefrom, each time over one row of domain positions. A simple series-parallel adaptation is thus realized.

The sixth means preferably comprise meander conductors which extend transverse to the first shift register, or displacement structures comprising discrete elements of soft-magnetic material. Displacement means of this kind are advantageous for displacing single domains as well as superposed domain pairs.

The array is preferably a hexagonal domain array having an inherently high stability. For a high information density, the array constant can advantageously be smaller than $2\frac{1}{2} \times$ the domain diameter.

The largest number of single domains or superposed domain pairs or both which can be accommodated in successive rows of the domain grid preferably each time equals n, the third means alternately being unblockable for activation each time after $n+\frac{1}{2}$ and $n-\frac{1}{2}$ periods. A simple organization is realized when input and output are separated. The first and the second shift register are then preferably simultaneously drivable.

The transverse coincidence propagation out of the first shift register and the transverse coincidence propagation into the second shift register of a row of single magnetic domains or superposed domain pairs or both preferably coincide in the time. This results in a simple organization. The serial drive of the two shift registers is preferably also combined.

The detector unit is preferably constructed as a display unit for the simultaneous detection, by way of faraday rotation, of a set of magnetic domains or superposed domain pairs which occupy a two-dimensional, regularly shaped area within the domain array region. A display device of this kind forms an attractive part of a device for data processing.

Each of the magnetic crystalline sublattices preferably has a specific optical activity, the optical activities being mutually opposed per layer of magnetic material, the assembly of the layers of magnetic material causing, for corresponding magnetization different optical activities, so that under the influence of magnetic domains in one of the layers of magnetic material or of a superposed magnetic domain pair at least three different faraday rotations can be generated. A display device comprising at least three grey levels can thus be formed.

According to the invention there is also provided a device for storing and/or displaying digital information contained in magnetic domains. This device comprises a non-magnetic substrate layer and at least two layers of magnetic material which are structurally integral therewith and in each of which magnetic domains can be formed and sustained by a bias magnetic field which extends transverse to the layers. It also includes a source for the selective generation of single domains or superposed domain pairs or both in the layers of magnetic material. The superposed domains of a pair are energetically connected by a magnetic compensation wall, otherwise all magnetic domains repel each other in a direction parallel to the layers. It also includes propagation means for the domains and a shift register, which adjoins on one side a domain array region into which the domains are serially driven in a first direction. The domain array region is bounded by further means along the sides which are transverse to the shift register. The coincident propagation means are adapted inter alia for driving a row of domains from the shift register to the domain array region transverse to the direction of the shift register into the array such that successive rows of domains in the array are staggered over one half period of the shift regsiter.

BRIEF DESCRIPTION OF THE DRAWINGS

The invention will be described in detail hereinafter with reference to the accompanying drawings in which.

DESCRIPTION OF THE PREFERRED EMBODIMENTS

The following description is successively devoted to the physical properties of the magnetic domains and superposed domain pairs, the generation of the domains, the domain grid region, and in detail to the manipulation of magnetic domains and domain grids.

PHYSICAL PROPERTIES

The magnetic domains for use in a device in accordance with the invention can be generated in layers of yttrium iron garnet (YIG), composed according to the formula $Y_3Fe_5O_{12}$, which are formed in the liquid phase by epitaxial growth (LPE), so that they form a structural unit. This is possible because there is only a small difference in the crystalline grid constants when the composition changes. The crystal has a mainly cubic structure, comprising three crystalline sublattices in which other ions can be substituted (without the structural unit being interrupted), i.e. the dodecahedral crystalline sublattice which is formed by the yttrium ions (substitution by La, Ca, Ga, Sm, Nd, Pr, Gd, Eu), the octahedral crystalline sublattice which is formed by 40% of the iron ions (substitution by Ga, Al) and the tetrahedral crystalline sublattice which is formed by the remaining 60% of the iron ions (substitution by Ga, Al, Ge, Sr). This list of substitute elements is given by way of example. In view of the valence of the ions, in some cases additional substitution in the dodecahedral positions is necessary for charge compensation. The magnetic effect of the dodecahedral crystalline sublattice can be ignored in many cases, like the magnetic influence of the oxygen ions. The overall magnetization in these ferrimagnetic garnets then equals the vectorial sum of the magnetizations of the crystalline sublattices which are completely or substantially completely oppositely directed. The substitution position is co-determined by the relative dimensions of the ions. If the overall magnetization is almost zero at a given temperature, its value critically depends on the distribution of the ions between the octahedral and tetrahedral crystalline sublattice. The condition N (magnetization)=0 defines a very thin anti-ferromagnetic region (magnetic compensation wall). A gallium-gadolinium-garnet layer is used as the non-magnetic substrate layer. The thicknesses of the layers of magnetic material may be approximately $5\mu$.

A uniform background magnetic field is applied transverse to the plate for the detection of the domains. The domains then cause faraday rotation of transmitted polarized light, which is detected on the exit side of the plate by means of an analyser. A number of transmitted intensities can then be individually discriminated by means of an analog-to-digital converter.

Figure 1:
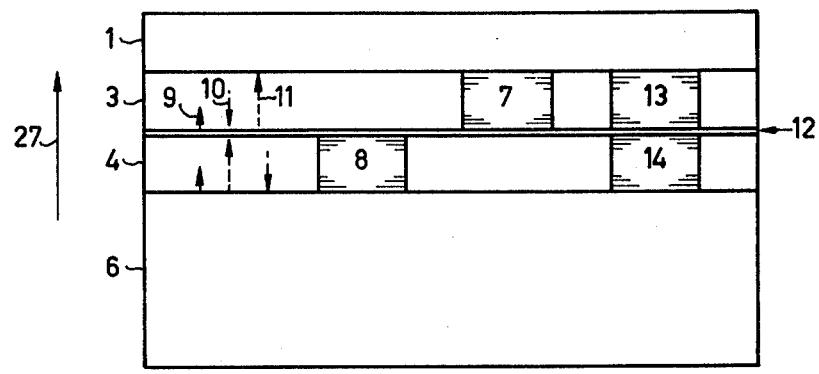
FIG. 1 is a sectional view of a number of magnetic layers in accordance with the invention.

FIG. 1 is a sectional view of a number of layers of magnetic material according to the invention. The layer 6 is a non-magnetic substrate layer. The layers 3 and 4 are layer of magnetic material as previously described. The layer 1 is a cover layer of $SiO_x$ ($1 \leq X \leq 2$) deposited on the layer of magnetic material by RF sputtering at a moderate temperature (substantially lower than that used for the LPE process). The invention, however, is not restricted to the use of the LPE process. The thicknesses of the layers are not shown to scale. Outside the magnetic domains 7, 8, 13, 14, the magnetizations of the octahedral crystalline sublattices of the layers 3 and 4 are mutually opposed, as is indicated by the arrows 10. The same is applicable to the magnetizations of the tetrahedral crystalline sublattices which are denoted by the arrows 11. The arrow 11 is orientated oppositely to the arrow 10 in each layer of magnetic material. The dominance of the arrow 11 in the layer 3 and the arrow 10 in the layer 4 is caused by selective doping of the substitution ions. the magnetization of the dodecahedral crystalline sublattice is ignored. The background magnetic field is directed upwards in accordance with the arrow 27. The resultant magnetization of the crystalline sublattices in the layers 3, 4 is directed upwards as denoted by the arrows 9.

Figure 2:
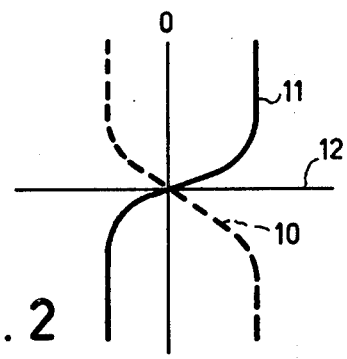
FIG. 2 graphically represents the detailed structure of a magnetic compensation wall.

These layers 3, 4 are thus separated by a magnetic compensation wall having a structure as represented by FIG. 2. The curve 11 represents the vertical variation of the magnetization of the tetrahedral crystalline sublattice, while the curve 10 represents the magnetization of the octohedral crystalline sublattice. At the compensation plane (interface) 12 the sign of all magnetizations changes. In the region of this interface a thin transition layer (compensation wall) is present which has anti-ferromagnetic properties. Within each of the magnetic domains 7, 8, 13, 14 the relevant magnetizations of the crystalline sublattices are each time opposite to the corresponding magnetizations outside the domains in the respective layers. The faraday rotation is mainly determined by the magnetization of the octahedral crystalline sublattice. As a result, the faraday rotation inside the domains opposes the faraday rotation outside the domains in each layer. In the configuration shown the domains 7, 8 have a mutually repellent force which includes a comparatively large component in the plane of the layers of magnetic material. A force of this kind also exists between magnetic domains in the same layer.

If the distance between the domains 7, 8 becomes smaller a force of attraction will occur. The superposed domain pair 13, 14 thus forms a stable configuration as regards relative displacement of the constituent domains. These two domains are again connected by a magnetic compensation wall. The overall faraday rotation through two superposed domains (13, 14) may be or may not be equal to the overall faraday rotation in a background region where no domain is present. Furthermore, it is possible to separate the layers 1 and 3 and the layers 4 and 6 by further layers of magnetic material, successive layers being each time separated by a magnetic compensation wall, these further layers can also contain magnetic domains which are single or superposed.

In the more general case the dodecahedral crystalline sublattice can also have an effect. It is merely necessary for one of the three magnetizations to be directed oppositely to the other two magnetizations if the magnetization of the octahedral crystalline sublattice (O) opposes that of the other two (dodecohedral D and tetrahedral T), the following possibilities exist. In this respect all sorts of disturbances are ignored, for example open positions in the lattice structure and undesired further substitutions

| (a) | $|D + T|$ | > | $|O|$ | $|T|$ | > | $|O|$ |
| (b) | $|D + T|$ | > | $|O|$ | $|T|$ | < | $|O|$ |
| (c) | $|D + T|$ | < | $|O|$ | $|T|$ | << | $|O|$ |

These properties can be achieved, for example, in the material $(Y_{3-x}Sm_x)_D (Fe_{2-y}Ga_y)_O (Fe_{3-z}Ga_z)_T O_{12}$. If Ga is substituted, approximately a fraction a = 10% thereof will go to the octahedral positions. The following substitution quantities are then applicable for the limits of the three magnetization regions $$y+z= <1.375 \qquad (a)$$

$$1.375<y+z<1.43 \qquad (b)$$

$$y+z>1.43 \qquad (c)$$

In the case $(Y_{3-x}La_x) (Fe_{2-y}Ga_y) (Fe_{3-z}Ga_z) O_{12}$, assuming that a = 10%, exact compensation is obtained at $2y=\tau z \cdot (a+1)=1.375$. The dodecahedral crystalline sublattice then does not contain any magnetic ions. In the case $(Y_{3-x}Ca_x) (Fe_2) (Fe_{3-x}Ge_x)O_{12}$, exact compensation is reached for x=1.

Various possibilities exist for the arrangement of the magnetic layers. In the case of three magnetic crystalline sublattices per layer, the following possibilities exist for a combination of two layers of magnetic material, referring to the three regions: a+b; b+c; c+a. The magnetic layers can have a different thickness. wherein the stability of the regions is influence. Furthermore, the value of the Faraday rotation is linearly determined by the thickness of the magnetic layer. Furthermore, the dodecahedral and tetrahedral crystalline sublattices can have opposed magnetizations. Certain rare earth metals have a magnetization parallel to that of the iron atoms, while the magnetization of others is antiparallel. The magnetization of the dodecahedral crystalline sublattice can even be directed parallel to the magnetization of the iron ions. The magnetizations of Nd+++ and Pr+++ is parallel to that of Fe+++; in the periodic system the magnetizations of the elements (ions) Ga+++ to Yb+++ are anti-parallel thereto. Furthermore, Eu+++ and Sm+++ have an inversion point as a function of the temperature, so that the temperature may be a further parameter of the operation of a device in accordance with the invention.

THE GENERATION OF THE DOMAINS

Various methods of generating magnetic domains are known. For example, U.S. Pat. No. 3,958,211 discloses a method where a domain is split by local influencing of the bias magnetic field. Within a current loop there are two separate preferred domain positions which are formed, for example, by small spots of permalloy, vapor deposited onto the layer of magnetic material. Under the influence of a reduction of the locally present bias magnetic field, a domain becomes so large that both preferred positions are occupied. Under the influence of a local increase of the bias magnetic field, the domain is split, a split-off domain automatically being moved away from the current loop along a rail-like domain guide structure.

Furthermore, U.S. Pat. No. 4,091,459 discloses a method where an original domain is continuously present on a substantially square element of permalloy which is vapor deposited on the layer of magnetic material. This element adjoins a propagation structure of the T-I type. During each period of a rotary magnetic field which rotates in the plane of the plate, a domain is split-off and transported along the guide structure. Under the influence of a temporary reversal of the sense of rotation of the rotary magnetic field, switching elements can be activated, so that the path to be followed by the splitoff domain is selectively controlled. The information contents of a series of generated domains formed can thus be modified.

U.S. Pat. No. 3,905,040 discloses a further method of generating magnetic domains by means of a locally injected pulse of laser radiation. If the temperature first rises to the compensation temperature, a domain remains behind when the compensation temperature is reached again in the downward direction. A domain is thus directly created instead of split-off. The temperature rise can be accompanied by a local decrease of the bias magnetic field. Magnetic domains can be destroyed in a corresponding manner.

The magnetic domains for use in a device according to the invention can be generated in a similar manner. A multiple layer of magnetic materials can be filled with strip-like domains at a low intensity of the bias magnetic field, the magnetizations of the successive strips being alternately parallel and anti-parallel to the bias magnetic field. Depending on the temperature and the thicknesses and compositions of the different layers, the transition to the circular magnetic domains occurs at a given magnetic field increase.

Figure 3:
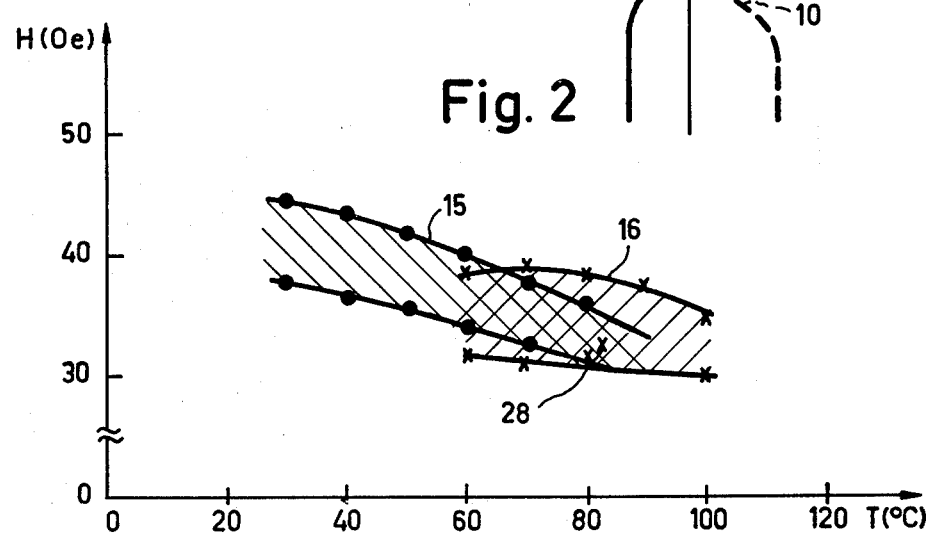
FIG. 3 shows stability regions for domain configurations.

In this respect, FIG. 3 shows an example of stability regions as a function of temperature (the shaded regions are stable). The material used for the magnetic double layer had a nominal composition of $Y_{2.85}La_{0.15}Fe_{3.75}Ga_{1.25}O_{12}$, the differences between the two layers being caused by a different distribution of the Ga ions among the crystalline sublattices. Meanwhile, phenomena of this kind have been observed in magnetic double layers of different composition. The single hatched area below the curve 15 in the figure indicates the stability region for a superposed domain pair such as 13, 14 of FIG. 1. In this example, thin additional layers of magnetic material in which no domains were present were provided between the layers 1 and 3 and between the layers 4 and 6. As has already been stated, these additional layers are not essential to a device according to the invention. The single hatched area below the curve 16 (oppositely hatched to the area below the curve 15) represents the stability region for a single magnetic domain, for example, the domain 7 of FIG. 1. If, at a temperature and field where these two areas overlap the bias magnetic field is then locally or uniformly increased, first a superposed domain pair 13, 14 is converted into the single domain 7, and then even this domain implodes when the field becomes even stronger. The two transitions of the example occurred starting from the point 28 in FIG. 3, at a temperature of approximately 80° C. with the bias field at 35.5 and 38.5 Oerstedt, respectively. Larger differences can be realized in other materials, but a difference of 3.0 Oerstedt is large enough for readily effecting the selective conversion of a superposed domain pair into single domain. The differences between the two layers of, in this case, substantially the same composition were realized, for example, by way of the temperature of the bath during the epitaxial growth process. The stability regions depend on the thicknesses and compositions of the layers of magnetic material and on the temperature. In the case of other compositions and/or thicknesses, the described effects can also occur at room temperature. Furthermore, in given cases the use of amorphous layers may be advantageous. If the thicknesses of one or more layers of magnetic material exhibit a spatial variation, an increase of the bias magnetic field can convert a domain pair 13, 14 into a domain of the type 7 in one position, and into a domain of the type 8 in an other position. It is also possible to locally apply a different temperature for influencing the stability interval. If a conversion has been realized by way of a field increase, it cannot be reversed by a subsequent decrease of the magnetic field.

Similarly, the process can be started at the position 28 and the temperature can be locally increased by a laser radiation pulse. When the curve 15 is then reached, a superposed domain pair can again be converted into a single domain. The end result can be influenced by a suitable choice of the starting point.

Figure 4:
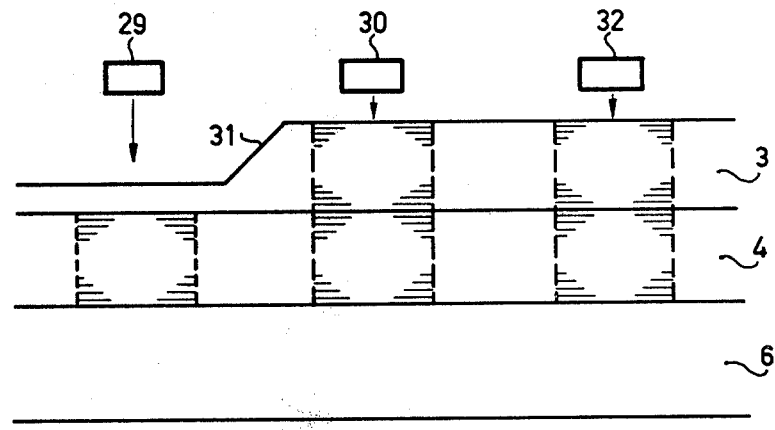
FIG. 4 is a sectional view of an embodiment of a generator for magnetic domains and superposed domain pairs.

In this respect, FIG. 4 shows a generator for different types of magnetic domains. The numbering of the various layers corresponds to that of FIG. 1. The elements 29 and 30 are generators, for example, of one of the types described above. The thickness of the layer 3 at the area of the generator 29 is insufficient to sustain a stable domain; this is in contrast with the local thickness of the layer 4 and the thicknesses of the two layers at the area of the element 30. When the element 29 is activated, a single domain is produced; however, when the element 30 is activated, a superposed domain pair is produced. The device can furthermore comprise a domain guide structure, for example, a structure consisting of discrete, vapor deposited permalloy elements of the T-I type. This structure is not separately shown. The domain pairs are generated at the source 30 and are driven to the information generator 32. This element comprises an activatable current loop whereby the bias magnetic field is then intensified, so that a passing superposed domain pair can be converted into a single domain in the layer 3. The single domains of the element 29, the domain pairs of the element 30, the single domains of the element 32 and any empty domain positions can be driven together as a multiple series to a converging switch, a single series of domain positions then appearing on the output of the switch. In the case of two layers of magnetic material, there are at most four possibilities per domain position and the maximum information content amounts to two bits per domain position.

On the other hand, the elements 29, 30, 32 can also be consecutively arranged along a single guide structure: the slope at 31 does not exert an opposing force on a domain in the layer 4 which moves from the left to the right in the figure. Similarly, a domain generator of the type of element 29 can be arranged in a location where the layer 4 is too thin (or possibly too thick) to enable storage of stable domains. The information in the ultimate flow of domains and domain pairs is determined by the synchronization of the cooperation between the domain generators, the domain destruction elements (element 32) and the drive mechanism for domains.

The Domain Array Region

Figure 5:
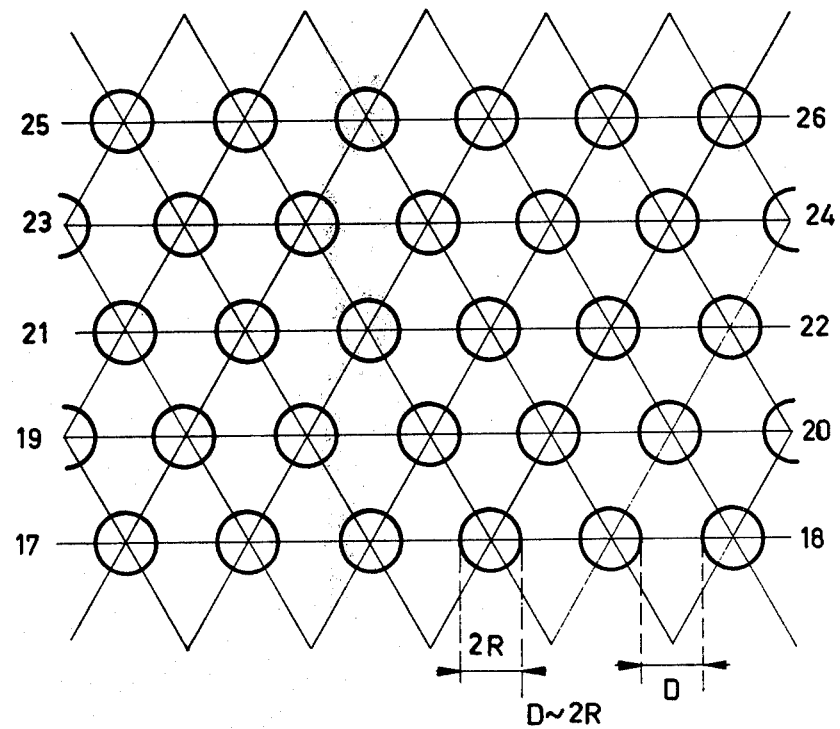
FIG. 5 shows a close-packed hexagonal domain grid.

FIG. 5 shows a hexagonal close-packed domain array. When an array of this kind is used, a high information density can be realized for superposed domain pairs and single domains because the domains are very stable as regards disturbances by neighboring domains. The intermediate space, D, between directly neighboring domains approximately corresponds to the domain diameter 2R. The domains can be driven along the lines 17/18, 19/20 . . . 25/26 by drive means yet to be described. In the direction perpendicular to these lines, the domains then form rows having a period per row of $(D+2R)\sqrt{3}$; the domain positions of successive rows are staggered over one half period. The domains can alternatively be driven in the two other directions which are denoted by uninterrupted lines; in that case it is not necessary for the array parameters to be exactly equal in all three directions. In some configurations the drive can also be effected along the medians of the elementary, substantially equilateral triangles of the domain positions.

Figure 6:
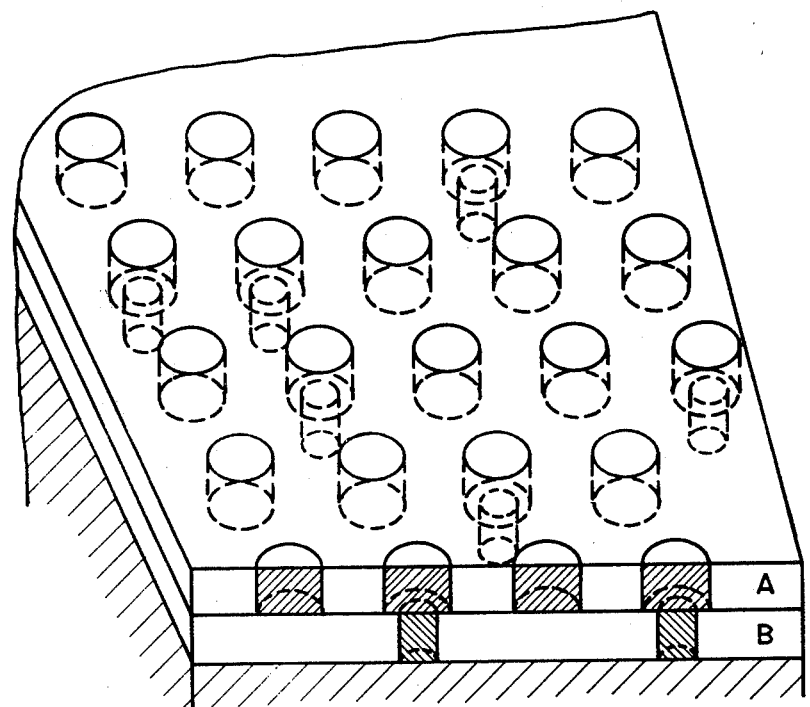
FIG. 6 is a perspective view of a close-packed domain array comprising single domains and superposed domain pairs.

FIG. 6 is a diagrammatic perspective view of a close-packed domain array with single domains and superposed domain pairs. The magnetic domains in the layer A form a fully occupied close-packed hexagonal domain array. A domain can be present or absent in a position, in the layer B which corresponds to a domain position in the layer A. Thus a hexagonal close-packed array is formed which has a very high stability and an information storage of one bit per domain position.

Figure 7:
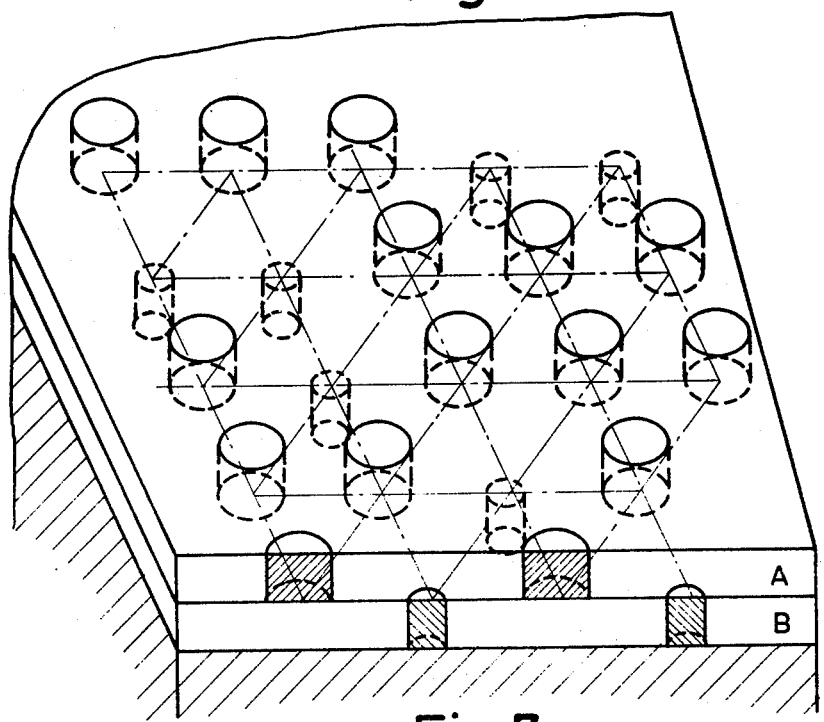
FIG. 7 is a perspective view of a close-packed domain array exclusively comprising single domains.

FIG. 7 is a perspective view of a close-packed hexagonal domain array containing exclusively single domains; the single domains form a completely filled grid, one single domain being present in each domain position. As a result, a parity check can be performed, because the number of domains per position is always odd. The diameters of the domains in the layer A and the layer B can be substantially different, as is shown in the FIGS. 6, 7. Depending on the thicknesses and the compositions of the layers, they could also be approximately equal. The diameters of the domains often approximately equals the thickness of the relevant layer of magnetic material. The thickness of the layer is mainly determined by the duration of the LPE process used. The details of the crystalline structure also depend on the temperature during growth. Furthermore, the material properties can be chosen so that the repellent forces between the domains for the distance between the domains used are substantially independent of the kind of domains i.e. the layer in which a magnetic domain occurs or whether a single domain or a superposed domain pair is concerned. A very regular array is thus feasible.

Figure 8:
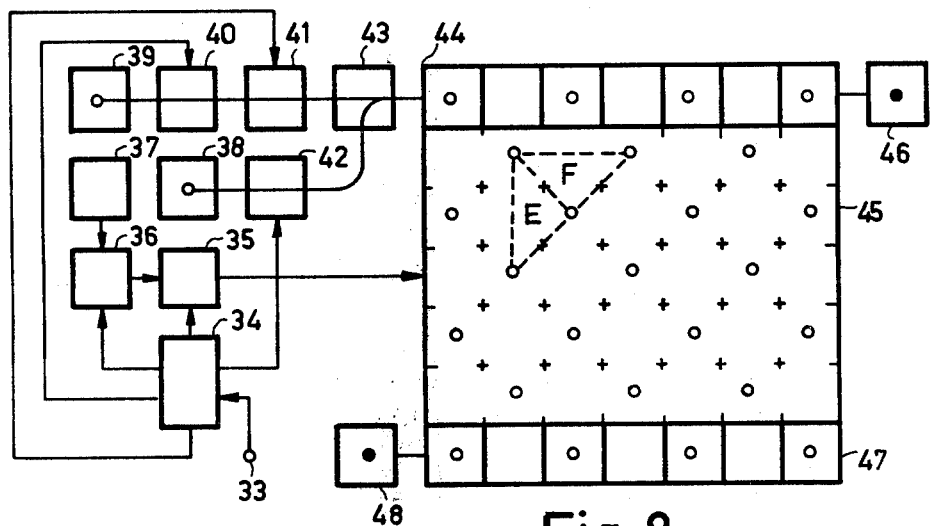
FIG. 8 is a block diagram of a device in accordance with the invention.

FIG. 8 shows a device according to the invention, comprising an information input terminal 33, a control device 34, a drive device (coincident propagation means) 35, a comparison device 36, a rotary field control device (propagation means) 37, a source 38 and a source 39 (both being magnetic domain generators), an annihilation device 40, an annihilation device 41, an annihilation device 42, a converging switch 43, an input shift register 44, a domain array device 45, a domain annihilation element 46, an output shift register 47, and a domain annihilation element 48. The layers of magnetic material are not separately shown.

The information input terminal 33 receives the digital information, for example, in the form of groups of alternately three and four bits, or in the form of a continuous flow from which these groups are formed by the control device 34. The control device 34 can also perform a parity check and can have a buffer function, but the invention is not limited thereto. Outside the domain array region the domains are driven, for example, by a rotary magnetic field in the plane of the device, while inside the domain array region they are driven, for example by meander conductors which carry current pulses as will be described later. Subsequently, the control device 34 applies the information "14+x" to the comparison device 36, as will be described later, the value of "x" being determined by the distances between the domain sources 38, 39 and the first position of the input shift register 44. Furthermore, via a connection which is not shown, the rotary field control device 37 receives a reset signal from the control device 34, so that a counter included therein is set to zero. The rotary field control device 37 controls a rotary field generator (not shown) which excites a rotary field coil pair (not shown either), the position of the counter in the rotary field control device being increased by "1" each quarter period of the rotation of the rotary magnetic field. The sources 39, 38, act as the sources 30, 29, respectively, in FIG. 4 and in each full period of the rotary magnetic field they produce, for example by splitting off an original domain, a superposed domain pair and a single magnetic domain in the first layer of magnetic material. The distance between the source 39 and the implosion device 40 corresponds, for example; to two periods of the rotary magnetic field, so that a domain pair formed arrives at the device 40 two periods later. If the implosion device 40 is activated by a signal from the control device 34 after the two periods, a locally present superposed domain pair is converted into a single domain in the second layer of magnetic material. The distance between the elements 40 and 41 corresponds, for example, to two periods of the rotary magnetic field. If the implosion device 41 is activated by a signal from the control device 34 after the two periods, a locally present single domain or superposed domain pair is destroyed, which may be described as creating an empty domain position. The distance between the elements 38 and 42 corresponds, for example, to two periods of the rotary magnetic field. If the implosion device 42 is activated by the control device 34 after the two periods, a locally present domain in the first layer of magnetic material is converted into an empty domain position. The distance between the elements 41 and 43 and between 42 and 43 amounts to, for example, two and four periods, respectively, of the rotary magnetic field. The distance between the elements 43 (converging switch whereby all remaining single magnetic domains in the first and the second layer of magnetic material, superposed domain pairs and empty domain positions are combined to form a single information flow in series) and the first position of the first shift register 44, denoted by a circle, amounts to, for example, two periods of the rotary magnetic field. The distance between the exreme positions of the shift register, denoted by circles, amounts to three periods of the rotary magnetic field. In this case the overall length between the sources 38-39 and this last position is 11=44/4 periods. This number of periods of the rotary magnetic field is thus required for filling the input shift register 44 completely with domains domain pairs, and empty positions in the locations denoted by circles. The value of the said quantity "x" in this case amounts to 44-14=30. When the comparison device 36 detects the position 44 of the counter in the rotary field control device 37 it applies a signal to the coincident propagation means. If this device receives an approval signal, to be discussed hereinafter, from the control device 34, the domain array region 45 is activated so that all domains present therein, hence also the empty domain positions, are shifted downwards by one row, the shift register 44 then being vacated. The control device 34 comprises an indication flip-flop (not shown) which until this time has had the value "0", for controlling the number "44". Each time the drive device 35 is activated, the flip-flop is switched over; after one change-over, it controls the value "42" instead of "44". If a row of domain information is again to be stored in the domain array region 45 after a prolonged period of time, the foregoing is repeated, the value of "x" being changed to 28 under the control of the "1"-position of the indication flipflop, the indication flipflop then being reset to the "0"-position; the domain positions (in this example, 3) are shifted one half period less after they have been generated by the sources 38, 39. The formation of the value "44" (101100) can be effected as follows. The non-underlined bit positions are permanently generated, while the underlined bit positions are the "1" and the "0" output, respectively of the indication flipflop; when the flipflop is switched over, the binary value "42" (101010) is automatically formed. Corresponding numbers of periods can be formed for other proportions of the device.

The rotary magnetic field can be continuously present for generating the further domains and domain positions containing information. This may be advantageous, for example, when other parts of the device are continuously activated by a rotary magnetic field of this kind. The sense of rotation of the rotary magnetic field can possibly be reversed for further control (further described below). Under the control of an additional signal "no input information", the implosion device 41 and/or the implosion device 42 can be activated each time when a domain is passed, i.e., each time, for example, in the same phase of the rotation of the rotary magnetic field, so that the series of domains are not combined at the converging switch 43. Furthermore, the generation of domains itself can temporarily be interrupted, by arranging that the rotary field must cooperate for the purpose of generation with other means, for example, a repetitive laser pulse or a current loop which is each time to be activated, the additional means then being temporarily inactive for an interruption of domain generation. The domains which have completely passed through the shift register 44 are destroyed in a known domain annihilation element 46. Similarly to the shift register 44, the output shift register 47 is activated and the domains are destroyed in the annihilation element 48.

If the rows of information domains directly succeed each other from the converging element 43 (i.e. when the control device 34 receives the information in a continuous flow), then the indication flipflop is still operated as described above so that it is always known whether the next row of the domain array region comprises three of four domain positions. In addition, the value of "x" is continuously made equal to zero, for example by an additional signal received on the input 33 which is decoded by a decoder included in the control device 34, thus forming the binary number 001110 (14). The underlined "0" bit positions are formed by an output of a "continuous state" flipflop: the underlined "1" bit positions are formed by the other output of the said flipflop via an OR-gate whose other input is then connected, as described, to an output of the indication flipflop. The coincident propagation means 35 is then activated after every 14/4=3½ periods of the rotary magnetic field in order to advance the domain population of the domain array region over one row.

In the example shown, four domains are present in the shift register 44. Consequently, a fifth domain is situated in the domain array one full period in front of the first position of the shift register. However, in the next row that fifth domain must be shifted until it is into the shift register one half period before the last position therein. Consequently, 1+2½=3½ periods of the rotary magnetic field are required for this purpose. The next domain (the eighth domain) is then situated ½ period in front of the first position of the shift register. A rotation of 3½ periods of the rotary magnetic field is then again required for moving the eighth domain to the last position of the shift register. The rotation stated can, depending on the size of the shift register, alternatively amount to 4½, 5½ or a higher number of (odd) half periods.

In FIG. 8 successive rows contain alternately three and four domains. The triangles E, F are isosceles and right-angled. This will be advantageous in certain cases, for example, if preferred positions are situated in the areas of the domain array region which are diagrammatically denoted by a square consisting of 4 crosses, one in each corner, in this case 5×7=35 in total. In certain cases it will be possible to have all preferred positions simultaneously occupied by a domain or domain pair. If the shift register 44 is shorter and the triangle F is equilateral, a hexagonal domain array is realized in which the domains are successively forced outwards by each other. If the shift register 44 is longer and the triangle E is equilateral, a hexagonal domain grid is again obtained. In the case of a hexagonal grid, for example, only the positions denoted by circles are active as preferred positions. Furthermore, in the domain array region 45, if applicable, domain pairs and empty domain positions can occur in the same way as single domains.

Figure 9:
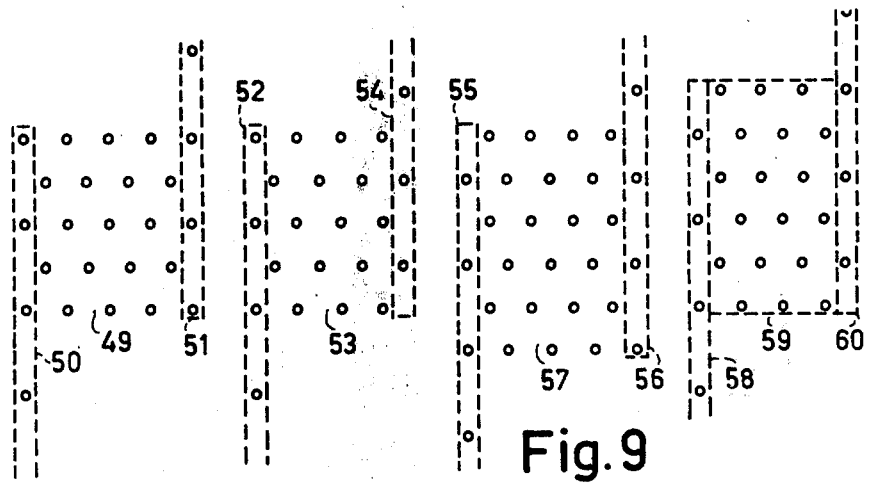
FIG. 9 is a diagrammatic representation of a part of further devices in accordance with the invention.

FIG. 9 shows a part of further devices according to the invention. The domain array region 49 comprises rows (vertically shown) of alternately two and three domain positions. In accordance with FIG. 8, in the case of a continuous flow of input information, 2½ periods of the domain displacement (by a rotary magnetic field or other means) are then required for filling the input shift register 50. Exactly these 2½ periods are again required for emptying the output shift register 51. In some cases it is not necessary to fill the input shift register completely, but the output shift register must always be completely emptied. The domain array region 49 comprises an odd number of rows. In some cases it is advantageous for the roles of input shift register and output shift register to be interchangeable, in that case a device for the selective generation of a series of domains containing information should also be connected to the input of the shift register 47 (at the right in FIG. 8). It is to be noted that the case shown does not represent the situation at a single instant, for the shift register 50, the situation is shown just before the activation of the coincident propagation means 35 of FIG. 8, for the shift register 51 the situation is shown just after the previous activation. The filling of the register 50 and the emptying of the register 51, therefore, must be effected in the same time interval, but it is not necessary that they are synchronously driven, the shift registers could comprise separate drive mechanisms.

The domain array region 53 is like the domain array region 49, but comprises an even number of vertically extending rows of domain positions which are denoted by circles. The row of domain positions in the input shift register 52 always requires, after the removal of the previous row, always $2\frac{1}{2}$ drive periods for re-occupying the positions shown. This is also sufficient for emptying the output register 54 completely.

The domain array region 57 comprises three domain positions in each row, and an odd number of rows. The row of domain positions shown in the input shift register 55 requires $2\frac{1}{2}$ drive periods, after the shifting of the row of domain positions into the domain array region, for re-occupying the positions shown. The row of domain positions shown in the output shift register 56 requires $3\frac{1}{2}$ periods for emptying the output shift register completely. The situation is exactly the opposite for the subsequent rows in input shift register and output shift register.

The domain array region 59 is like the domain array region 57, but comprises an even number of vertical rows of domain positions in this case $2\frac{1}{2}$ period suffice for the pattern shown for filling the register 58 and for emptying the register 60. For the subsequent rows, the corresponding value is $3\frac{1}{2}$ periods and so on in an alternating manner. If the shift registers are synchronously driven in this case, very simple operation is possible because, unlike in the example with domain array region 57, the registers do not have to wait for each other a given period of time.

The domain array regions shown are confined on two sides by shift registers. In certain cases, preferred positions for domains can be present only in the domain array region, because a slot in the sides of the magnetic material confines the domains therein. On the other hand, other means can also be provided, for example an external domain array which exerts an inwardly directed force on the domains containing information, a transition in the thickness or one or more of the layers of magnetic material, or known electromagnetically operating means, for preventing any outwardly directed movements of the domains.

Figure 10:
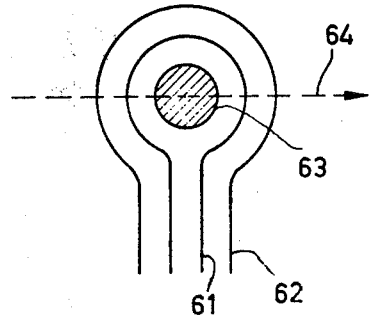
FIG. 10 shows an electrical detector for magnetic domains.

FIG. 10 is a plan view of an electrical detector for domains which is arranged on a plate in which the domains can be driven. The single domains, superposed domain pairs and any empty domain positions are driven along the domain guide structure 64 which is not shown in detail. When detection is desired, the conductor 61 is activated by an activation device not shown, the field of the conductor (amplifying the bias magnetic field) then causing annihilation of the magnetic domain 63. This induces a pulse in the conductor 62 which is determined in a specific manner by the quantity of flux reversed.

A distinction can thus be made between superposed domain pairs (13, 14 in FIG. 1), single domains (7, 8 in FIG. 1) and empty domain positions. The device can in some cases be proportioned so that a discrimination can also be made between the magnetic domains 7 and 8 of FIG. 1, for example in that they contain different quantities of magnetic flux to be reversed. Furthermore, the annihilation can be selectively controlled so that the pulse of the magnetic field is sufficient only to annihilate one of the two types of magnetic domains. Consequently, this method generally involves destructive reading. A detector of this kind can be arranged between the register 47 and the element 48 in FIG. 8 or, if desired it can replace the element 48.

Alternatively, a two-dimensional region containing magnetic domains in parallel can be made visible by means of polarizing plates on both sides of the layers of magnetic material, a light source being arranged on one side and a display system on the other side. In this manner a two-dimensional display device can be formed, for example dimensioned like the region 45 of FIG. 8. By differentiating Faraday rotation under the influence of a domain in a first or a second layer of magnetic material, or a superposed domain pair three different Faraday rotations can be converted into a corresponding number of grey values. An empty domain position can produce yet a fourth separate grey value.

The Manipulation of the Magnetic Domains

Figure 11:
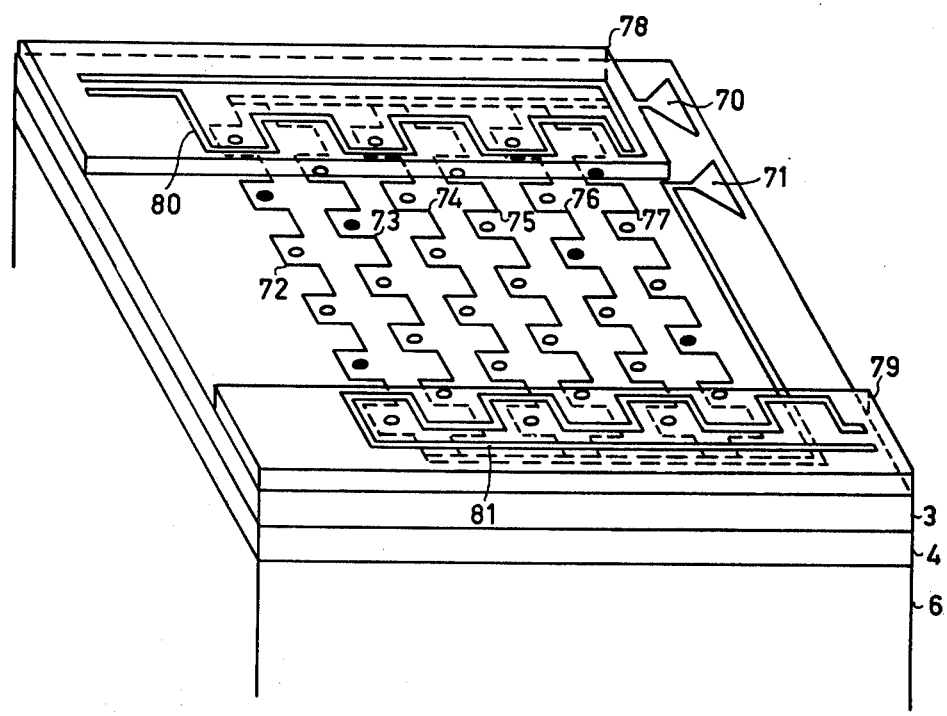
FIG. 11 shows a device in which the magnetic domains are driven by electrical current pulses in meander conductors for use in a device according to the invention.
Figure 12:
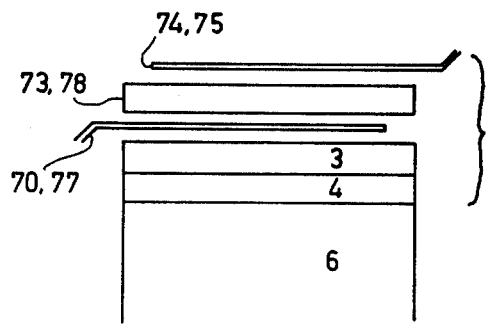
FIG. 12 is a diagrammatic cross-sectional view of a device as shown in FIG. 11.

FIG. 11 show the detail of a device for forming a hexagonal domain array for use in a device according to the invention. This example shows the non-magnetic substrate layer 6 and the two layers of magnetic material which are structurally integral therewith. In this simple example only single magnetic domains are shown i.e. those in the layer 3 (open circles) and those in the layer 4 (solid circles). On the layer 3 there is provided a first pattern of meander conductors 72, 73 . . . 77 which are connected in parallel by a common current input (70) and a common current output (71). The meander currents are substantially sinusoidal. The lines 70, 71 consequently can be connected to a coincident propagation means 35 of FIG. 8. The successive meander conductors have an alternating symmetry. On the pattern there are provided two strips of insulating material 78 79 which are similar to the layer 1 of FIG. 1. These strips may cover the entire plate. On the strip 78 there is provided the meander conductor 80 which forms the input shift register. On the strip 79 there is provided the meander conductor 81 which forms the output shift register. Consequently, the activation of these meander conductors replaces the rotary field control of the shift register described with reference to FIG. 8. The input and the output of the domains for the input and output shift registers have been omitted for the sake of simplicity. FIG. 12 is a sectional view of the device shown in FIG. 11, better clarity being provided by an artificial vertical separation of the elements which are denoted by the same references as used in FIG. 11.

Figure 13:
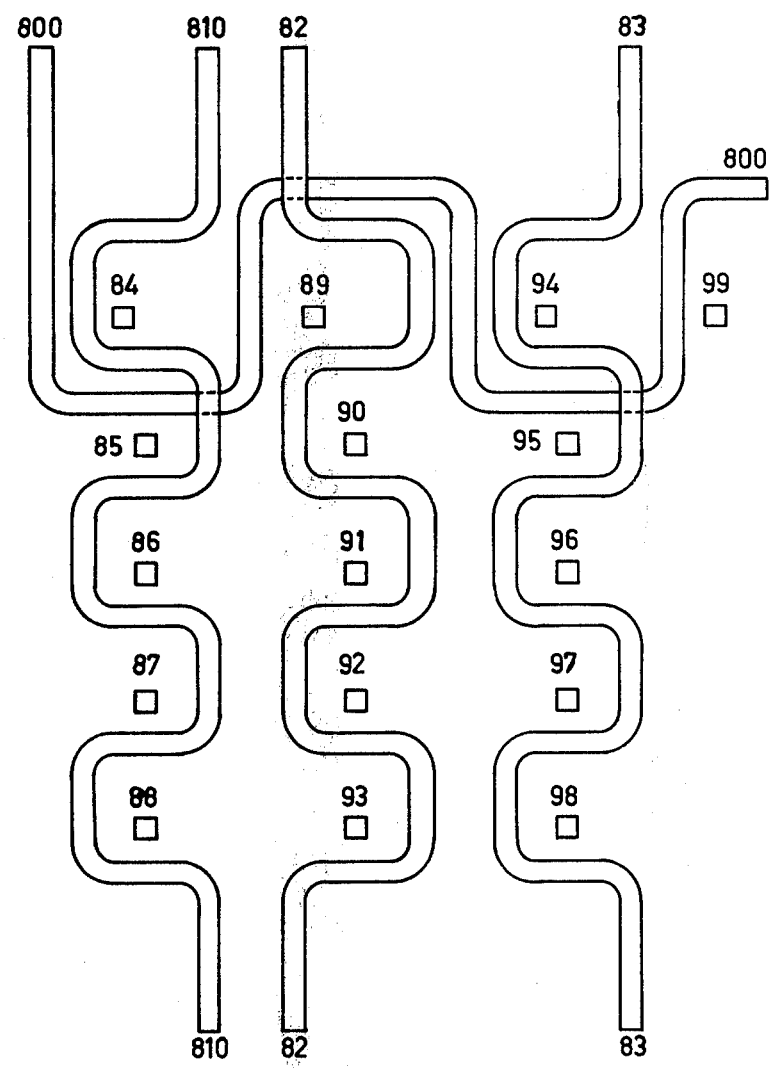
FIG. 13 in more detail shows the course of the meander conductors shown in FIG. 11.

FIG. 13 shows in greater detail the course of the meander conductors shown in FIG. 11. The meander conductors are activated, for example, by a sinusoidal current cycle. If the current through the meander conductor 800, for example, like that through all other meander conductors, equals zero, a preferred position for a magnetic domain is formed, for example, by a small vapor-deposited element 94 of soft-magnetic material such as permalloy. The layers of magnetic material are not separately shown. If the bias field at the area of the element 94 is intensified by a half cycle of the current in the conductor 800, the preferred position for a magnetic domain changes from this area to the area of the permalloy element 89 where the bias magnetic field is then attenuated. At the end of the half current cycle, the domain has thus been displaced to the element 89. Due to the asymmetrical location with respect to the conductor 800 (to the left) of the elements 99, 94, 89, 84, the transport direction is to the left when the conductor 800 is activated. Under the influence of the next half cycle of the current in the meander conductor, the domain is then displaced to the element 84. A single magnetic domain or a superposed domain pair can thus be shifted over successive half periods of the structure by each alternate polarity half cycle of the current in the meander conductor. Successive half cycles of the same polarity have no effect in this respect. The waveform of the current may be sinusoidal or otherwise.

When a domain or superposed domain pair is present on the element 89 and the meander conductor 82 is activated by a half cycle of a current whereby the bias magnetic field is locally intensified, the preferred position is changed from the element 89 to the area of the element 90. Due to the downwards shift of the elements 89 . . . 93, the direction of displacement is downwards when the meander conductor 82 is activated. The same is applicable to the meander conductors 810 and 83. Thus, domains and superposed domain pairs can be displaced from the elements 84, 94, to the elements 85, 95, respectively, by simultaneous activation of the meander conductors 810 and 83. The same is also applicable to a displacement from the element 90 to the element 91. A series/parallel converter is thus formed. Meander conductors 800, 810, 82, 83, consequently can be perform, for example, the functions of the meander conductors 80, 72, 73 and 74, respectively, of FIG. 11. The conductor 800 constitutes the input shift register and a similar conductor can perform the function of output shift register in the same manner when it is located at the lower ends of the meander conductors 810, 82, 83.

The dimensions of the loops of the meander conductors 810, 82, 83 in FIG. 13 are substantially equal to the dimensions of the domains. In certain cases they may even be slightly smaller. The meander conductor 800 comprises loops whose pitch is approximately 5/3 times as large. The difference between these two dimensions can be further reduced in certain cases.

If the dots are small (as shown) a preferential position for the magnetic domains, at zero meander current, could extend from one dot to the next one, whereby the bubble edges coincide with the dots. If this were to occur, all directions of motion would be reversed.

Figure 15:
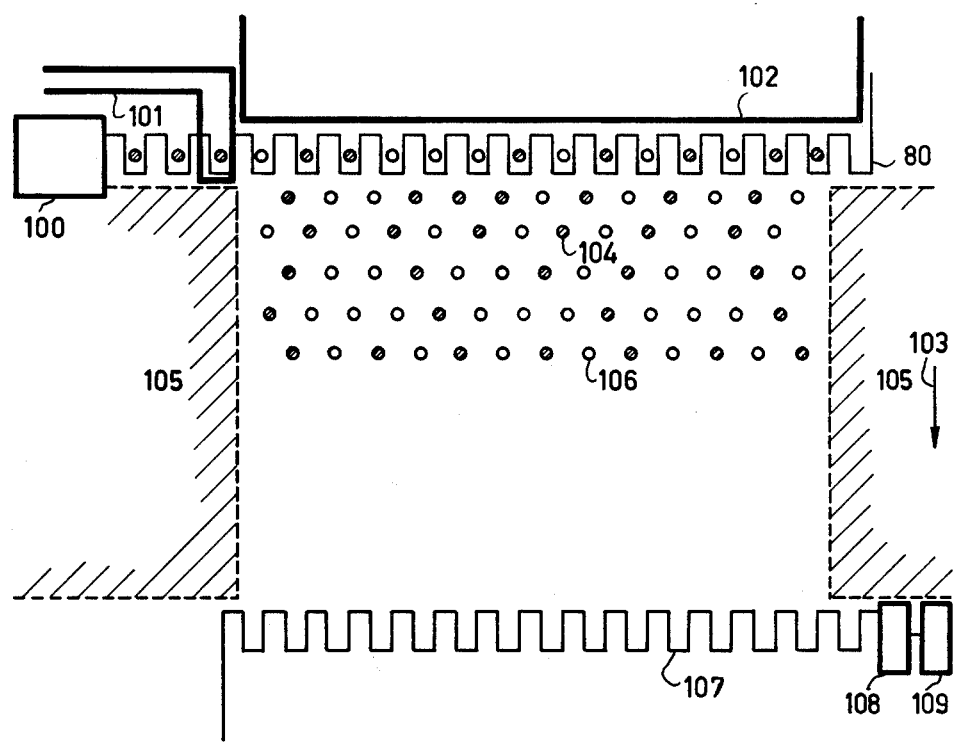
FIG. 15 is a front view of a device which has been simplified with respect to FIG. 11.

FIG. 15 is a diagrammatic view of a device which has been simplified with respect to FIG. 11. The meander conductor 80 serially drives domains (open circles) and superposed domain pairs (solid circles) after they have been generated by the generator 100. This generator produces only superposed domain pairs, the information being provided by the implosion loop 101 which is driven in synchronism with the operation of the generator 100 by a control device not shown. When the input shift register (80) has been completely filled, the output conductor 102 is activated by a current pulse whereby the bias magnetic field at the area of the input shift register is intensified and the domains and domain pairs are driven out in the direction 103, thus shifting the information in the domain array 104 forward by one period. Additional means may also be provided for this purpose, for example, a gradient in the bias magnetic field. These additional means can certainly be dispensed with if the depth of the domain array transverse to the input shift register is limited. The shaded areas 105 which bound the domain array region, may be provided, for example, by the magnetic layer in which the single domains 106 occur being absent at these areas. The domain array can fill the entire region between the shift registers 80 and 107 (output shift register). In other cases, the array will preferably be in the vicinity of the first shift register 80 as shown. The output shift register 107 drives the domains, in the same manner as the register 80, to a non-destructive detector 108 and a domain destruction element 109.

Figure 14:
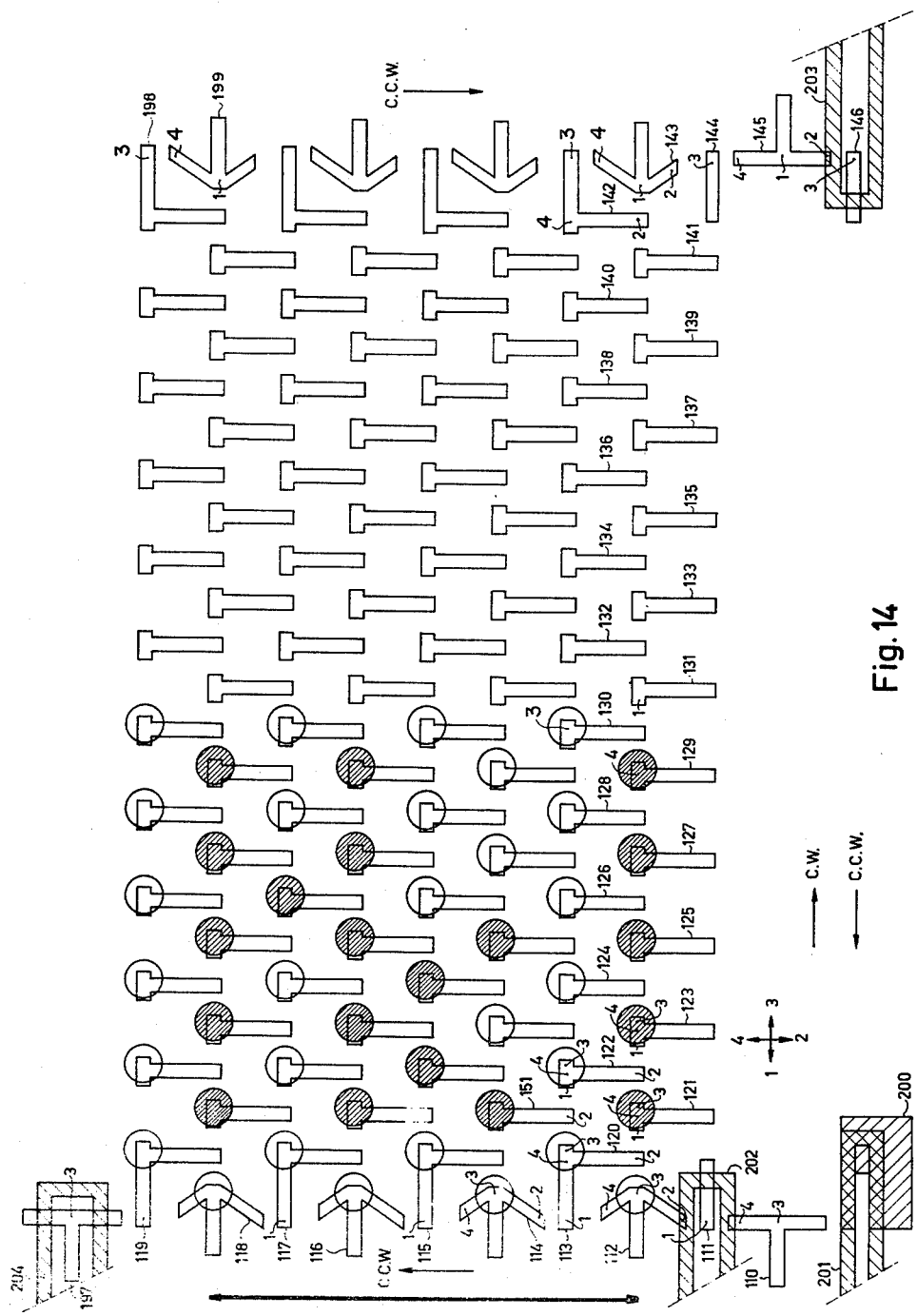
FIG. 14 shows the detail of part of a further device in accordance with the invention, in which the magnetic domains are driven by a rotating magnetic field in conjunction with a domain guide structure consisting of discrete elements of permalloy.

FIG. 14 shows a further elaborated device according to the invention, in which the domains are driven exclusively by a rotating magnetic field. The domain guide structure consists of discrete elements of permalloy, vapor-deposited on the magnetic material. Only these elements are shown in the figure as such. When the rotating magnetic field is directed to the right, a domain is preferably present on an end of a permalloy element which is directed towards that side, for example, in the position 4 of the element 110, notation position 1104. When the field rotates counter-clockwise in the upwards direction, the domain (or superposed domain pair) jumps to the position 1 on the element 111 (notation 1111). "Upwards" is to be understood to correspond to the direction of the arrow 1 of the inserted system of coordinates, "to the right" is in the direction of arrow 4, etc. When the field rotates to the left, the next position will be 1122. When the field rotates downwards, the next position will be 1123, and when the rotation is continued, the positions 1124, 1131 . . . 1191 will be reached. The elements 112–119 constitute the input shift register of the domain array region. During each period of the rotary magnetic field which then rotates counter-clockwise, the generator 200 splits off, in conjunction with the activation of the current loop 201, a superposed domain pair from a superposed original domain pair which is continuously present at this area. When this domain pair reaches the position 1111, conversion into a single magnetic domain can be achieved by selective activation of the loop 202.

When the single or superposed domains in the input shift register occupy the positions 1123, 1143, 1163, 1183 as shown and the direction of rotation of the rotary magnetic field becomes clockwise, the domain will move from the position 1123 to the position 1202 rather than to the position 1122, because the former position is nearer. This is determined by a combination of geometrical and magnetic factors. In the case of continued clockwise rotation, the series of preferred positions will then be 1211, 1214, 1213, 1222 . . . .

The domain initially present in the position 1303 will then reach the position 1423 in 6 periods in clockwise rotation. When the rotation subsequently becomes counter-clockwise again, the next preferred position will be 1434 rather than 1424, because the former position is nearer. The next preferred position will then 1431, 1432, 1443, 1454, 1451, 1452, 1463. Implosion can be initiated in the latter position by a current pulse in the conductor loop 203 (the latter may be constructed as a detector in accordance with FIG. 10). The transport of the last domain from the position 1983 to the position 1463 requires 5 periods of counter-clockwise rotation. The same counter-clockwise rotation drives the domains in the domain array region in the direction of the input shift register and, moreover, new domains and superposed domain pairs are generated thereby. The domain initially present in the position 1313 requires 5½ periods of counter clockwise rotation in order to reach the position 1211. Newly produced domains then occupy the positions 1131, 1151, 1171, 1191 (and 1111), but this domain is not taken into consideration), so that an uninterrupted array is reconstructed. When the rotation subsequently becomes clockwise again, the domain will move from the position 1131 to the position 1134 rather than to the position 1124, because the former position is nearer. After six periods of clockwise rotation, the first row of domains will have reached the position 1431 . . . 1991. For this domain, in the case of renewed counter-clockwise rotation, the next preferred position will be 1432 rather than 1422, because the former position is nearer. After 4½ periods of counter-clockwise rotation, the last domain of the position 1991 to be detected will have reached the position 1463. After 5½ periods of counter-clockwise rotation, the most recently introduced row of domains will have reached the position 1203 etc. (it being assumed that there is an upwards directed field). Newly generated domains are then present in the positions 1103, 1123, 1143, 1163, 1183 and 1973. During the next clockwise rotation, the domain in the position 1103 will be reunited with the original domain. The domain in the position 1973 will be annihilated by a suitable current pulse in the conductor loop 204. For the remainder, the starting situation has then been reached again.

Thus each time an array of 6×8 bubbles is propelled to the output shift register side. Upon rotation reversal only 44 bubbles return, while the inflow of four new bubbles in the input shift register is synchronized with the output from the output register. When the input register is exactly full, the 6×8 array is present again.

Figure 16:
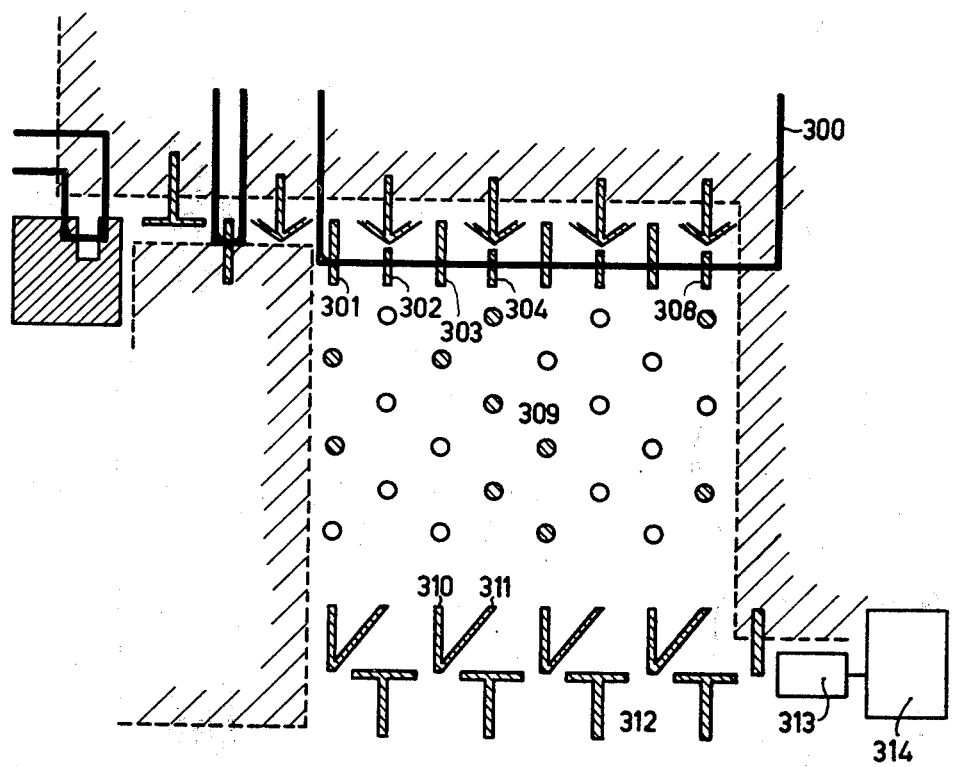
FIG. 16 shows a device which has been simplified with respect to FIG. 14.

FIG. 16 shows a device which has been simplified with respect to FIG. 14. The generation of the input information is effected in the described manner. When the input shift register has been filled, one or more output conductors (see also FIG. 15), the conductor 300 being shown as an example, is activated for driving out the information domains in the transverse direction, first the permalloy elements 301 . . . 308 and subsequently the domain array region 309 being reached. The front row of domains each time reaches the straight or oblique poles of permalloy V-pieces (310) and is subsequently discharged to the annihilator 314, via the T-bar structures and the detector 313, by clockwise rotation of the rotary magnetic field. The bounding of the domain grid has been described with reference to FIG. 15.

What is claimed is:

1. A device for storing digital information in the form of magnetic domains, comprising:
   a control device having an information input terminal;
   a non-magnetic substrate layer;
   a first layer of magnetic material, structurally integral with said substrate layer;
   a second layer of magnetic material, structurally integral with said first layer of magnetic material;
   a bias magnetic field generator for producing a magnetic field extending transverse to said first and second layers for sustaining magnetic domains therein;
   first magnetic domain generating means operative at a first position for locally and sequentially producing a first series of magnetic domains in said first layer;
   second magnetic domain generating means operative at a second position for locally and sequentially and synchronously with said first domain generating means producing a second series of magnetic domains in said second layer;
   propagation means for moving magnetic domains away from the first and second domain generating means in synchronism with said first domain generating means;
   said control device controlling said first and second domain generating means for selectively forming single magnetic domains or superposed magnetic domain pairs in said first and second layers of magnetic material, superposed magnetic domain pairs comprising a magnetic compensation wall at their interface, all single magnetic domains and superposed magnetic domain pairs being mutually repulsive including a force component in the plane of said layers;
   said first and second layers each comprising at least two magnetic crystalline sublattices with first and second magnetizations which have substantially opposite directions, corresponding sublattices within said first and second layers having magnetizations in opposite directions at locations where there are no magnetic domains in either layer;
   detector means for the separate detection of single magnetic domains and superposed magnetic domain pairs;
   annihilation means for destroying single magnetic domains and superposed magnetic domain pairs;
   a first shift register for serially receiving single magnetic domains or superposed magnetic domain pairs generated by said first and second domain generating means;
   a two-dimensional domain array region, having a lattice of domain positions, situated adjacent the first shift register;
   coincident propagation means for the coincident driving of a row of magnetic domains from said first shift register transversely into the domain array region; and
   confinement means for bounding the domain array region on edges thereof which are transverse to said first shift register, and on an edge which is remote from said first shift register;
   wherein said control device activates said coincident propagation means at instants separated by intervals corresponding to integral numbers of half periods of the propagation means, said intervals having at least a predetermined minimum value for the successive formation of an array of rows of magnetic domains in directions along said first shift register in the domain array region.

2. A device as claimed in claim 1 wherein, in addition to controlling said first and second domain generating means, said control means further controls said propagation means for selectively forming single magnetic domains or superposed magnetic domain pairs in said first and second layers of magnetic material.

3. A device as claimed in claim 1 wherein said intervals correspond to odd numbers of half periods of the propagation means, said minimum value being one half unit smaller than the largest number of domain positions in a single row within the two-dimensional domain array region.

4. A device as claimed in claim 3 further comprising domain array propagation means for advancing, in cooperation with said coincident propagation means, the two-dimensional domain array in the direction transverse to said first shift register, each time advancing the domain array by one row and in a direction away from said first shift register.

5. A device as claimed in claim 4 wherein the domain array propagation means comprise meander conductors which extend in the direction transverse to the first shift register.

6. A device as claimed in claim 4 wherein the domain array propagation means comprise displacement structures having discrete elements of soft magnetic material.

7. A device as claimed in claim 3 wherein the domain array lattice positions comprise a hexagonal lattice.

8. A device as claimed in claim 7 wherein the largest number of single domains or superposed domain pairs or both which can be accommodated in successive rows of the domain array region alternately equals n and n+1, respectively, said coincident propagation means being activated after each $n + \frac{1}{2}$ periods.

9. A device as claimed in claim 7 wherein the largest number of single domains or superposed domain pairs or both which can be accommodated in successive rows of the domain array each time equals n, said coincident propagation means alternately being activated after $n + \frac{1}{2}$ and $n - \frac{1}{2}$ periods.

10. A device as claimed in claim 3 wherein the confinement means includes, on an edge which is remote from the first shift register, a second shift register which is arranged parallel to the first shift register, said second shift register being adapted to coincidentally receive a row of single magnetic domains or superposed magnetic domain pairs or both from the domain array region and further being adapted to serially output the magnetic domains located therein.

11. A device as claimed in claim 10 further comprising domain array propagation means for advancing, in cooperation with the coincident propagation means, the two-dimensional domain array in the direction transverse to the first shift register, each time advancing the domain array over one row of domain positions in a direction toward the second shift register, and for controlling the storage of the domains in the second shift register in coincidence with the driving of the domains out of the first shift register.

12. A device as claimed in claim 11 wherein the first and second shift registers are synchronously driven by the propagation means.

13. A device as claimed in claim 3 wherein the stability of the two-dimensional domain array is determined by the repulsive forces between the single magnetic domains and the superposed magnetic domain pairs or both at a grid constant which is less than $2\frac{1}{2}$ times the domain diameter.

14. A device as claimed in claim 3 wherein the detector means is constructed as a display device for the simultaneous detection, by Faraday rotation, of a set of single magnetic domains or superposed magentic domain pairs or both which occupy a two-dimensional uniformly shaped region within the domain array region.

15. A device as claimed in claim 3 wherein each of the magnetic crystalline sublattices has a specific optical activity, said optical activity being oppositely directed in each adjacent layer of magnetic material, the composition of the layers of magnetic material causing, for corresponding magnetization, different optical activity, so that under the influence of single magnetic domains or of superposed magnetic domain pairs at least three different Faraday rotations can be separately generated.

16. A device as claimed in claim 3 wherein the successive rows of domains in the domain array region are staggered over $\frac{1}{2}$ period of the propagation means in the direction of the first shift register.

* * * * *